(12) United States Patent
Yamada

(10) Patent No.: US 6,573,979 B2
(45) Date of Patent: *Jun. 3, 2003

(54) CLEANING METHOD FOR USE IN EXPOSURE APPARATUS

(75) Inventor: Kohei Yamada, Utsunomiya (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/248,104

(22) Filed: Feb. 11, 1999

(65) Prior Publication Data

US 2002/0012112 A1 Jan. 31, 2002

(30) Foreign Application Priority Data

Feb. 16, 1998 (JP) ............................ 10-048615

(51) Int. Cl.[7] ........................ G03B 27/58; G03B 27/42
(52) U.S. Cl. ........................ 355/72; 355/53
(58) Field of Search ........................ 355/18, 30, 53, 355/72, 55

(56) References Cited

U.S. PATENT DOCUMENTS

| 5,559,582 A | 9/1996 | Nishi et al. ............... 355/30 |
| 5,563,684 A * | 10/1996 | Stagaman ............... 355/72 |
| 5,825,470 A | 10/1998 | Miyai et al. ............... 355/72 |

FOREIGN PATENT DOCUMENTS

| EP | 0 692 318 | 1/1996 |
| JP | 5-82411 | 4/1993 |
| JP | 5-198470 | 8/1993 |
| JP | 6-115868 | 4/1994 |
| JP | 7-130637 | 5/1995 |
| JP | 7-130638 | 5/1995 |
| JP | 9-283418 | 10/1997 |

* cited by examiner

Primary Examiner—Russell Adams
Assistant Examiner—Peter B. Kim
(74) Attorney, Agent, or Firm—Fitzpatrick, Cella, Harper & Scinto

(57) ABSTRACT

An exposure apparatus includes a chuck having a holding surface for holding a substrate, a stage for holding the chuck, a moving mechanism for moving the stage, an urging mechanism for holding a whetstone and for urging the whetstone against the holding surface, a conveying mechanism for conveying the whetstone to the urging mechanism, and relay pins, retractably protruding from the holding surface. The relay pins, when protruding from the holding surface, are operable to relay the whetstone between the urging mechanism and the conveying mechanism. The stage is moved while the whetstone is urged against to the holding surface, for cleaning the holding surface.

17 Claims, 6 Drawing Sheets

CLEANING METHOD FOR USE IN EXPOSURE APPARATUS

FIELD OF THE INVENTION AND RELATED ART

This invention relates to a cleaning method for use in a semiconductor exposure apparatus wherein a thin plate-like substrate such as a semiconductor wafer is held on a movable table (stage) and is processed by predetermined treatment. In another aspect, the invention is concerned with a method of cleaning a holding surface of a wafer chuck in such an exposure apparatus, or with a whetstone for the cleaning. In a further aspect, the invention is directed to a device manufacturing method using such an exposure apparatus.

In semiconductor exposure apparatuses, a thin plate-like substrate such as a semiconductor wafer having a photoresist coating is held by attraction on a movable table, and a reticle pattern is transferred to the substrate. If the substrate holding surface of the movable table is contaminated or if foreign particles are deposited thereon, the substrate held thereon is contaminated or local deformation of the substrate is caused at the portion where particles are deposited between the substrate and the substrate holding surface, which results in a decrease of yield or process quality, as is known in the art. It is, therefore, necessary that the substrate holding surface be cleaned periodically, to avoid these problems.

Conventionally, the cleaning of a substrate holding surface is made manually by polishing the substrate holding surface with the use of a whetstone or cleaning it with a cloth and solvent.

However, manually cleaning the holding surface quite uniform requires skills and, therefore, the quality is not even, depending on the skill of the operator or on the work on that day. Further, much time is necessary for the work, and it leads to a decrease of operation efficiency of the apparatus. From the viewpoint of the structure of the apparatus, it is necessary to provide a maintenance area for the cleaning, and it causes enlargement of the floor area for the apparatus or of the area occupied. Furthermore, in a small environment as represented by recent SMIF, doing the work itself while keeping a door of the apparatus open causes a factor for decreasing the cleanness inside the apparatus.

SUMMARY OF THE INVENTION

It is an object of the present invention to make it practicable to clean a substrate holding surface uniformly and in a short time without relying on the skill of an operator.

It is another object of the present invention to make it practicable to clean a substrate holding surface without lowering the cleanness inside the apparatus.

It is a further object of the present invention to reduce a maintenance area required for the cleaning.

In accordance with an aspect of the present invention, there is provided an exposure apparatus, comprising: a chuck having a holding surface for holding a substrate; a stage for holding said chuck; a moving mechanism for moving said stage; an urging mechanism for holding a whetstone and for urging it against the holding surface; and a conveying mechanism for conveying the whetstone to said urging mechanism; wherein said stage is moved while the whetstone is urged against to the holding surface, for cleaning the holding surface.

The apparatus may preferably further comprise a conveying hand mechanism for conveying the substrate to the holding surface, wherein said conveying mechanism may use said conveying hand for conveyance of the whetstone.

The apparatus may further comprise a transfer member retractably protruded from the holding surface, wherein said conveying mechanism may transfer the whetstone between it and said urging mechanism by use of said transfer member as the same is protruded from the holding surface.

The urging mechanism may include a pressing mechanism for pressing the whetstone against the holding surface by a predetermined pressure.

The whetstone may be provided with a magnetic material, wherein said urging mechanism may be operable to perform mounting and demounting of the whetstone by use of an electromagnet.

The whetstone may be formed with a recess, and said urging mechanism may have a protrusion engageable with the recess.

The movement of said stage relative to the whetstone may comprise one of rectilinear motion, circular motion and a combination of rectilinear motion and circular motion.

The apparatus may further comprise a chamber having an opening through which the whetstone can be introduced into said exposure apparatus.

Said conveying mechanism may be operable to pick up the whetstone, as accommodated in a container cassette having been introduced into said exposure apparatus, out of the cassette and to convey it toward said urging mechanism.

In accordance with another aspect of the present invention, there is provided a cleaning method, comprising the steps of: conveying a cleaning whetstone to a holding surface of a wafer chuck by use of a wafer conveying mechanism for conveying a wafer; and cleaning the holding surface with the whetstone.

In accordance with a further aspect of the present invention, there is provided a cleaning method, comprising the steps of: conveying a cleaning whetstone to a holding surface of the wafer chuck; urging the cleaning whetstone against the holding surface; and moving a wafer stage relatively to the whetstone, whereby the holding surface is cleaned.

In accordance with a yet further aspect of the present invention, there is provided a cleaning whetstone for cleaning a holding surface of a wafer chuck in an exposure apparatus, comprising: a cleaning surface; and a holding portion engageable with a member for holding the whetstone, said holding portion having at least one of a step and a hole.

Said holding member may be provided by at least one of (i) an urging mechanism for urging the whetstone against the holding surface of the wafer chuck, (ii) a transfer member protruded from the holding surface of the wafer chuck, (iii) a positioning member for a whetstone cassette for accommodating the whetstone therein, and (iv) a hand mechanism for holding the whetstone by attraction and for conveying the same.

In accordance with a still further aspect of the present invention, there is provided a device manufacturing method, comprising the steps of: preparing an exposure apparatus as recited above; cleaning a holding surface for holding a substrate; and exposing the substrate with radiation.

The method may further comprise coating the substrate with a resist before the exposure, and developing the substrate after the exposure.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will now be described with reference to the accompanying drawings.

In one preferred embodiment of the present invention, an exposure apparatus comprises a conveying hand for conveying a substrate, to be exposed, to a holding surface, and whetstone conveying means for conveying a whetstone by use of the conveying hand. This removes the necessity of provision of conveying means exclusive for whetstone conveyance.

A whetstone conveying mechanism may have a transfer member freely projectable from and retractable from a substrate holding surface, so that transfer of a whetstone between it and an urging mechanism with intervention of the transfer member may be performed. For transfer of the whetstone, the transfer member may be protruded above the holding surface while, for cleaning of the holding surface, it may be embedded below the holding surface. Preferably, a surface step (level difference) may be defined between the holding surface and the surface of the whetstone supported by the transfer member. This enables vacuum attraction to the whetstone during transfer of the same by the transfer member, and prevents contamination of the transfer member or the like during whetstone conveyance after the cleaning.

An urging mechanism for urging the whetstone against the holding member may include a pressing mechanism for pressing the whetstone against the holding surface with a predetermined pressure. The whetstone may be provided with a magnetic material at a side remote from its cleaning surface, and the urging mechanism can perform mounting and demounting of the whetstone by use of an electromagnet and the magnetic material. A surface step in the form of a slot may be defined on the cleaning surface of the whetstone, and the urging mechanism may have a protrusion which is engageable with the slot when the whetstone is to be mounted. Movement of the stage relative to the whetstone may comprise rectilinear or rotary motion. This ensures that different points contacting the whetstone have the same relative speed, relative to the whetstone.

The exposure apparatus may comprise a chamber, and it may have an access opening for introducing a whetstone into the exposure apparatus. A whetstone conveying mechanism may serve to pick up a whetstone out of a whetstone containing cassette, having been introduced into the exposure apparatus while carrying the whetstone therein, and to convey the whetstone to the urging mechanism. This enables cleaning the holding surface without reducing the cleanness inside the apparatus, and prevents cleanness reduction inside the apparatus due to an external environmental factor.

Figure 1:
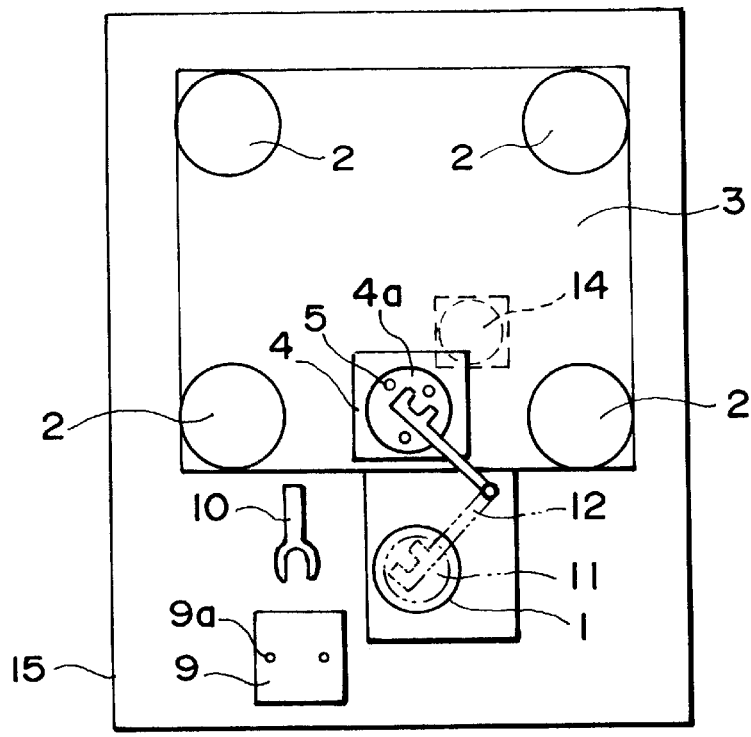
FIG. 1 is a top plan view of a semiconductor exposure apparatus according to a first embodiment of the present invention.
Figure 2:
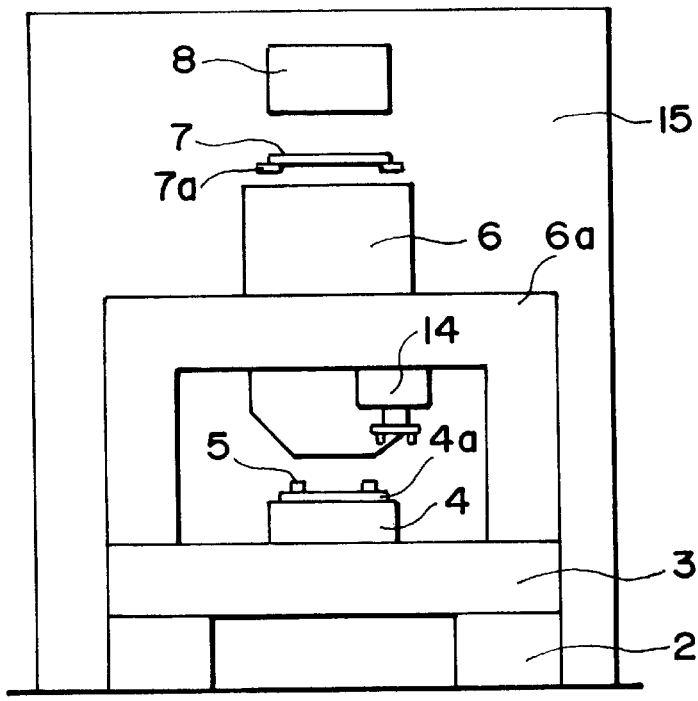
FIG. 2 is a front view of the exposure apparatus of FIG. 1.

FIGS. 1 and 2 are a top plan view and a front view, respectively, of an exposure apparatus according to a first embodiment of the present invention. Denoted in these drawings at 1 is a semiconductor wafer, and denoted at 2 is an anti-vibration mount for supporting the exposure apparatus. Denoted at 3 is a base which is supported by the mount 2, and denoted at 4 is a movable table which is provided on the base 3. Denoted at 4a is a wafer holding surface provided on the movable table 4. Denoted at 5 are substrate relay pins which are projectable upwardly from the wafer holding surface 4a. Denoted at 6 is a projection lens for projecting and imaging an exposure pattern, and denoted at 6a is a projection lens support table for supporting the projection lens 6. Denoted at 7 is a reticle having an exposure pattern, and denoted at 7a is a reticle holding table for holding the reticle 7. Denoted at 8 is an illumination system for illuminating the reticle 7. Denoted at 9 is a wafer cassette carrying table, and denoted at 9a are whetstone cassette positioning pins provided on the wafer cassette carrying table. Denoted at 11 is a wafer prealignment station. Denoted at 10 is a first wafer conveying hand which is operable to pick up a wafer out of a wafer cassette, placed the wafer on the wafer cassette carrying table 9, and to convey the wafer to the prealignment station 11. Denoted at 12 is a second wafer conveying hand for conveying the wafer from the prealignment station 11 to the wafer holding surface 4a. Denoted at 13 is a whetstone for cleaning the wafer holding surface 4a, and denoted at 14 is a whetstone urging mechanism for urging the whetstone 13 against the wafer holding surface 4a. Denoted at 15 is a chamber which serves to keep the whole apparatus clean.

Figures 3A, 3B:
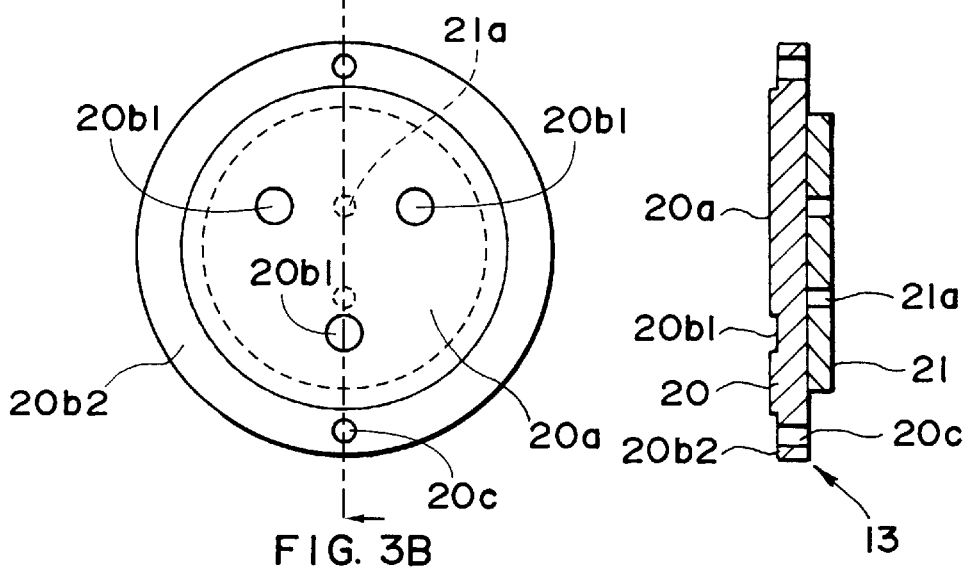
FIGS. 3A and 3B are a plan view and a sectional view, respectively, of a whetstone usable in the exposure apparatus of FIG. 1.

FIGS. 3A and 3B are a plan view and a sectional view, respectively, of the whetstone 13. As shown in these drawings, the whetstone 13 comprises a bottom plate 20 of alumina ceramics material which has a cleaning surface 20a, a conveyance holding surface 20b2 and fitting bores 20c for the positioning with respect to a whetstone cassette (to be described later), as well as a top plate 21, of magnetic material having positioning bores 21a for the positioning thereof. Between the cleaning surface 20a and the conveyance holding surface 20b2, there are three slots formed to define a small surface step 20b1 (level difference). This level difference 20b1 serves to prevent adhesion of any contaminants from the cleaning surface 20a, after the cleaning operation, to the conveyance holding surface 20b2.

Figure 4:
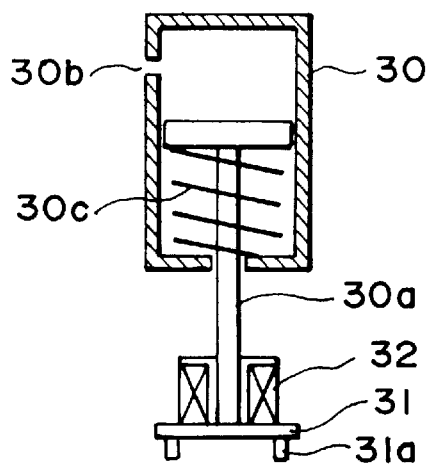
FIG. 4 is a schematic view of a whetstone urging mechanism usable in the exposure apparatus of FIG. 1.

FIG. 4 illustrates the structure of the whetstone urging mechanism 14 which is movable along an axis perpendicular to the wafer holding surface 4a while carrying the whetstone 13 thereon, and which is operable to urge and press the whetstone 13 toward and against the wafer holding surface 4a with a predetermined pressing force. As illustrated, the urging mechanism 14 comprises an air cylinder 30 and a piston shaft 30*a* thereof as well as a whetstone engaging portion 31 provided at a free end of the piston shaft 30*a* and having engaging pins 31*a* to be engaged with the positioning bores of the whetstone 13. The urging mechanism further comprises an electromagnet 32 for holding the whetstone 13 by attraction. At the upper end of the air cylinder 30, there is a positive pressure air inlet opening 30*b* through which air is introduced to urge the piston shaft 30*a* downwardly with a predetermined force. Disposed inside the air cylinder 30 is a spring 30*c* for urging the piston shaft 30*a* upwardly. The piston shaft 30*a* is provided with a rotation limiting mechanism (not shown) for preventing rotation thereof. As air of a predetermined pressure is introduced through the air inlet opening 30*b*, the piston shaft 30*a* moves downwardly to apply a predetermined pressing force to the whetstone 13. As the air inlet opening 30*b* is opened to the atmosphere, the piston shaft 30*a* moves upwardly under the influence of the spring 30*c*. The whetstone can be held as the electromagnet 32 is energized, and it can be released as the electromagnet is de-energized.

Figures 5A, 5B:
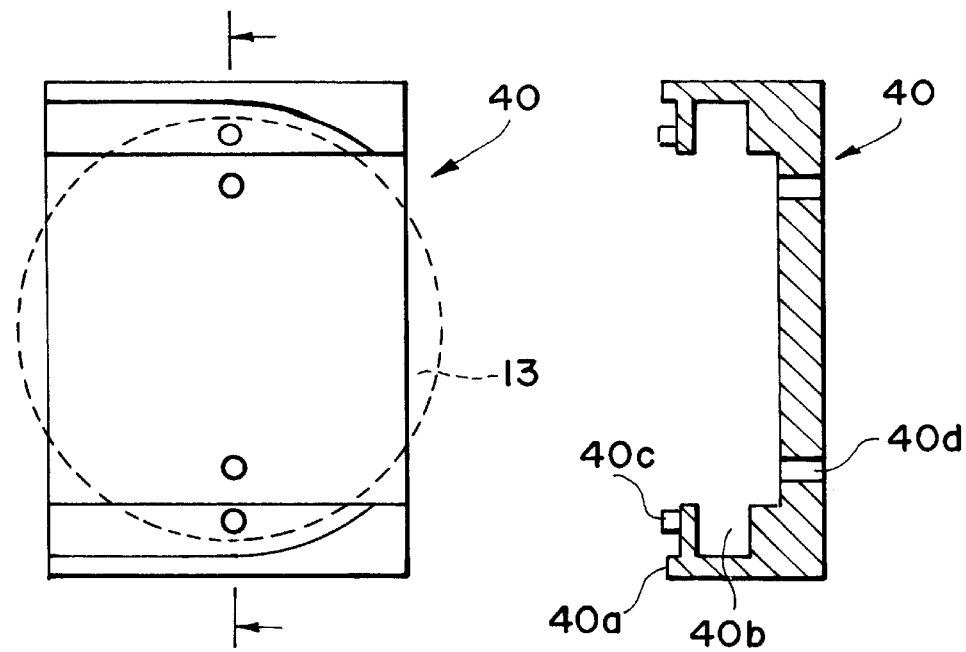
FIGS. 5A and 5B are a plan view and a sectional view, respectively, of a whetstone cassette usable in the exposure apparatus of FIG. 1.

FIGS. 5A and 5B are a plan view and a sectional view, respectively, of a whetstone cassette 40 which is used to place a whetstone 13 on the carrying table 9 for carrying a wafer cassette thereon. The cassette 40 includes two-level shelves 40*a* and 40*b* for accommodating the whetstone 13. At the shelf 40*a*, there are pins 40*c* to be engaged with the fitting bores 20*c* formed in the whetstone 13 for positioning the same. At the bottom surface of the cassette 40, there are fitting bores 40*d* engageable with the positioning pins 9*a* provided on the wafer cassette carrying table 9, for positioning the cassette 40.

When in the above-described structure a reticle pattern is going to be transferred to a wafer, a wafer presence/absence detecting sensor (not shown) detects a wafer 1 inside a wafer cassette (not shown) which is placed on the wafer cassette carrying table 9. On the basis of information detected, the wafer cassette carrying table 9 is elevated upwardly or downwardly by an elevating mechanism (not shown) and, then, the first conveying hand 10 picks up the wafer 1 out of the wafer cassette and conveys it to the wafer prealignment station 11. At the prealignment station 11, any deviation of the wafer 1 is detected by use of a sensor (not shown), and then the positioning of the wafer 1 is performed by means of a positioning mechanism (not shown). The wafer 1 thus positioned at the prealignment station is conveyed by the second conveying hand 12 onto the substrate relay pins 5, mounted on the movable table 4 at the wafer supplying position and being protruded above the wafer holding surface 4*a*. The wafer 1 thus held by the relay pins 5 can be lifted up as the substrate holding surface 4*a* is moved slightly above the relay pins 5 by a holding surface elevating mechanism (not shown), and it can be held by the substrate holding surface 4*a*.

Subsequently, the movable table 4 moves from the wafer supplying position to a first shot exposure position to bring the wafer 1 into registration with the imaging plane of the projection lens 6. Then, the illumination system 8 illuminates the reticle 7 held on the reticle holding table 7*a*, such that the reticle pattern is transferred onto the wafer 1 through the projection lens. Thereafter, exposures of the remaining shots are performed while moving the movable table 4 in accordance with a predetermined shot layout. As the exposures of all the shots are completed, the movable table 4 is moved to a wafer collection position, and the wafer holding surface 4*a* is moved down. Thus, the wafer 1 supported on the relay pins 5 can be collected by the first conveying hand 10 and conveyed into a wafer cassette (not shown). During this operation, the whetstone urging mechanism 14 is at its upper position, and it does not interfere with the operation.

Figure 6:
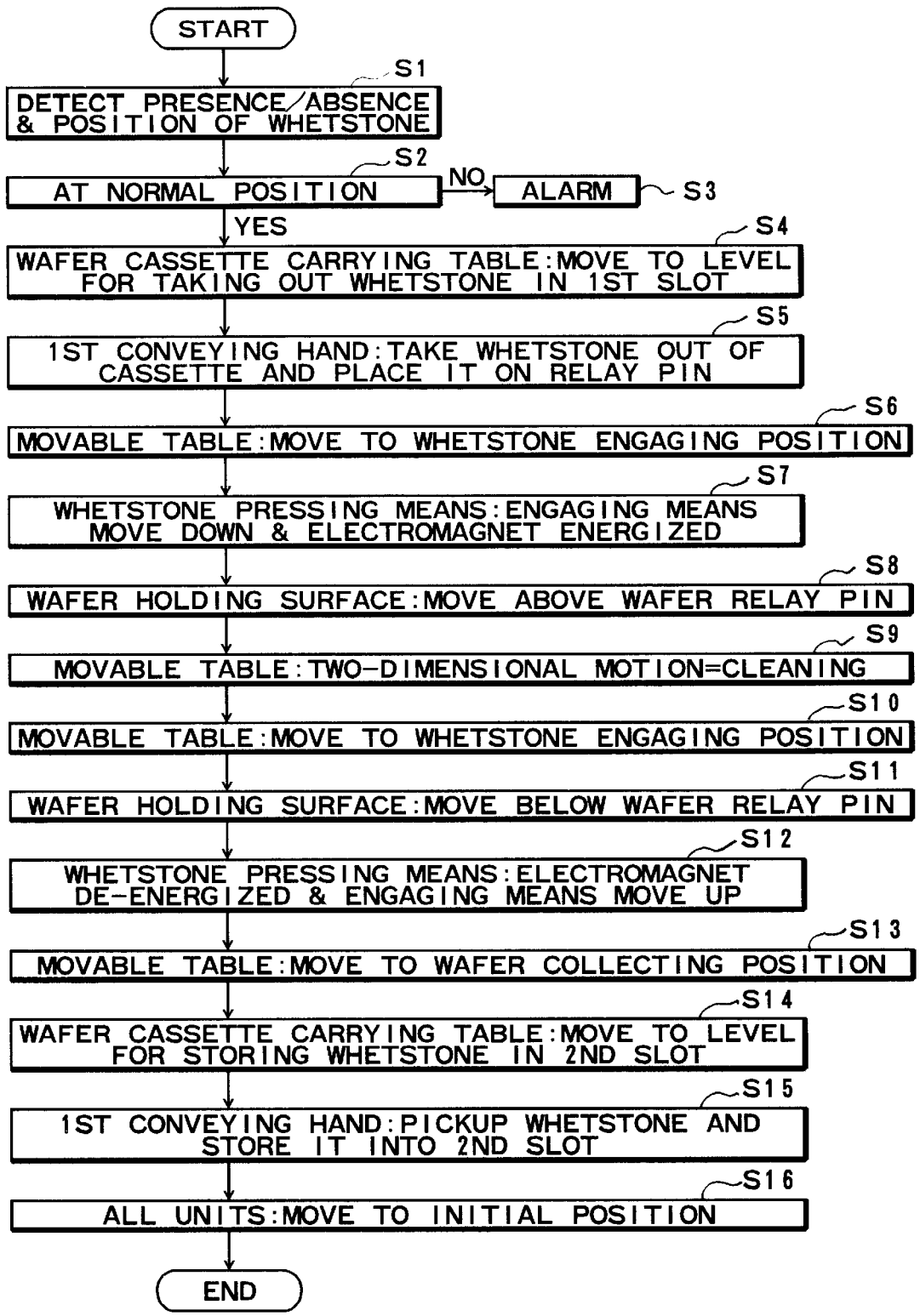
FIG. 6 is a flow chart for explaining the cleaning procedure to be made in the exposure apparatus of FIG. 1.

Next, the operation for cleaning the wafer holding surface 4*a* will be described with reference to the flow chart of FIG. 6.

First, a whetstone cassette 40 having a whetstone 13 accommodated in its shelf 40*a* is placed on the wafer cassette carrying table 9. In response to a cleaning start signal supplied from an operation panel (not shown), the cleaning operation starts. By using the wafer detection sensor (not shown) described above, presence/absence of the whetstone 13 as well as whether it is placed at a correct carrying position (i.e., at the shelf 40*a*) or not are detected (Steps S1 and S2). If any abnormality is detected, an alarm is produced (Step S3) for informing an operator that the whetstone 13 should be set again at its correct position. If the placement is correct, the wafer cassette carrying table 9 is moved upwardly or downwardly by means of the elevating mechanism (not shown) (Step S4). Then, the first conveying hand 10 holds the whetstone 13 by vacuum attraction and picks it up out of the whetstone cassette 40, and it moves the whetstone onto the substrate relay pins 5 on the movable table 4 which is at the wafer collection position (Step S5). Thus, the relay pins 5 hold the whetstone by surface step 20*b*1.

The whetstone 13 is held by the relay pins 5 through vacuum attraction and, thereafter, it is moved to underneath of the whetstone urging mechanism 14 (Step S6). Here, a positive air pressure is supplied into the cylinder 30 of the urging mechanism 14, whereby the piston shaft 30*a* is moved down. Then, the whetstone engaging portion 31 engages with the whetstone 13. The electromagnet 32 is then energized such that the whetstone 13 is held by attraction through its magnetic force (Step S7). Then, by using the substrate holding surface elevating mechanism (not shown), the substrate holding surface 4*a* is moved upwardly, slightly beyond the relay pins 5 (Step S8). The whetstone 13 and the substrate holding surface 4*a* are engaged and contacted with each other and, while keeping this state, the movable table 4 is moved rectilinearly, circularly or two-dimensionally based on the combination of rectilinear and circular motions. Thus, the whetstone 13 is uniformly contacted to the whole substrate holding surface 4*a*, for cleaning the same (Step S9).

After the cleaning is completed, the movable table 4 is moved back to the whetstone engaging position (Step S10). The substrate holding surface 4*a* is then moved down, and the whetstone 13 is held on the substrate relay pins 5 by vacuum attraction (Step S11). Thereafter, the electromagnet 32 is de-energized to release the holding force of the whetstone engaging mechanism 31. After this, the cylinder 30 is opened to the atmosphere, and the whetstone engaging mechanism 31 is moved upwardly (Step S12). Finally, the movable table 4 is moved to the wafer collection position (Step S13) while the whetstone 13 is conveyed to and accommodated into the whetstone cassette 40 by using the first conveying hand 10, whereby the cleaning process is finished (Steps S13–16).

The holding mechanism of the whetstone urging mechanism 14 is not limited to the use of the electromagnet 32. Preferably, the whetstone holding mechanism may serve to prevent disengagement of the whetstone 13 and the whetstone engaging mechanism 31 when during the cleaning operation the supply of positive pressure air which is a drive source for the whetstone urging mechanism 14 is interrupted, to thereby enable holding a clean whetstone constantly and performing the cleaning operation at a desired timing.

Figure 7:
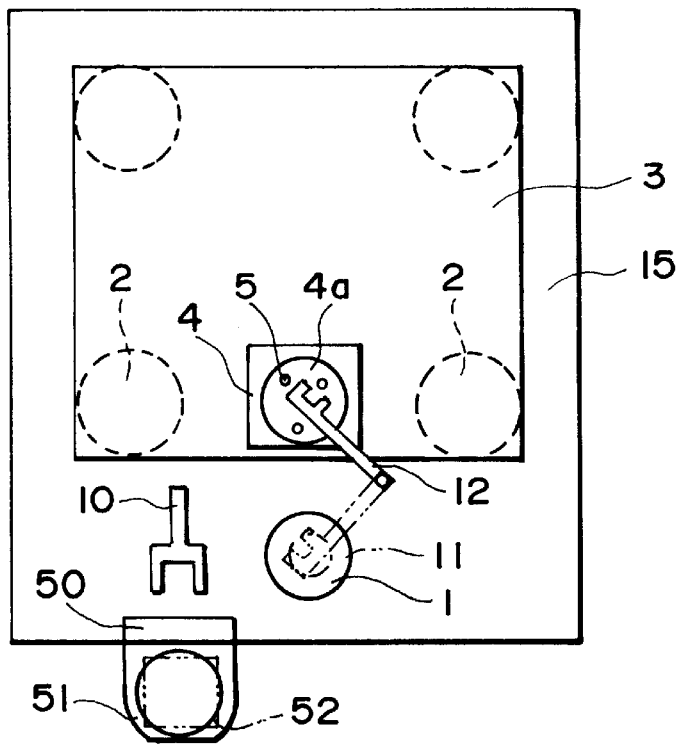
FIG. 7 is a top plan view of a semiconductor exposure apparatus according to a second embodiment of the present invention.

A second embodiment of the present invention will be described below. FIG. 7 is a top plan view of a semiconductor exposure apparatus according to the second embodiment, which differs from the first embodiment in that there is no wafer cassette carrying table such as at 9 and, in place, there is a front open type SMIF opening/closing mechanism 50. The mechanism 50 serves to supply a wafer. A whetstone 13 can be supplied into the semiconductor exposure apparatus from a SMIF box 51 having accommodated therein a whetstone supporting shelf 52 having a similar function as that of the whetstone cassette 40 described hereinbefore. The remaining portion has essentially the same structure as that of the first embodiment.

Next, an embodiment of a semiconductor device manufacturing method which uses an exposure apparatus such as described above, will be explained.

Figure 8:
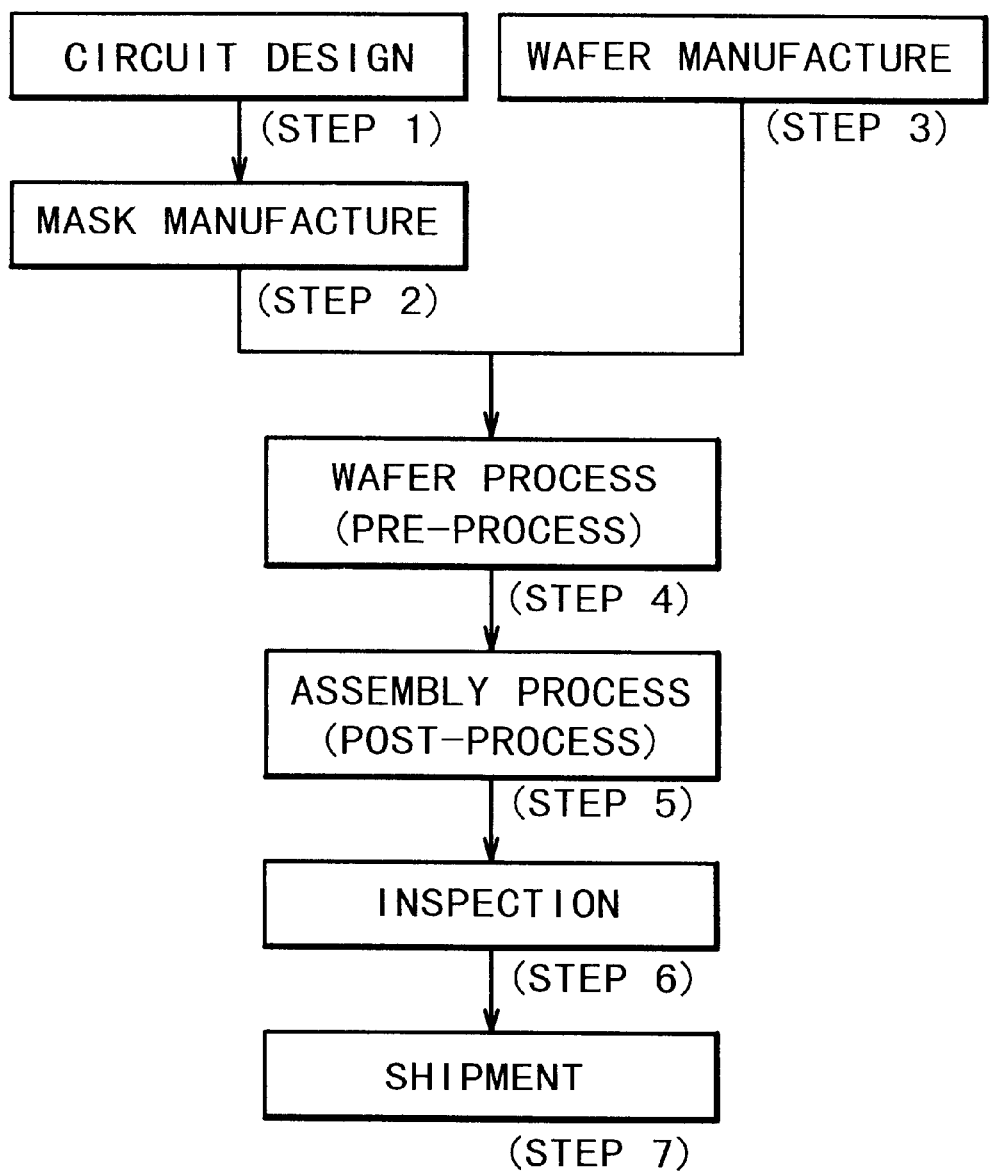
FIG. 8 is a flow chart of device manufacturing processes in which the apparatus and/or the method according to the present invention is usable.

FIG. 8 is a flow chart of a procedure for the manufacture of microdevices such as semiconductor chips (e.g., ICs or LSIs), liquid crystal panels, CCDs, thin film magnetic heads or micro-machines, for example.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the so prepared mask and wafer, circuits are practically formed on the wafer through lithography. Step 5 subsequent to this is an assembling step which is called a post-process wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

Figure 9:
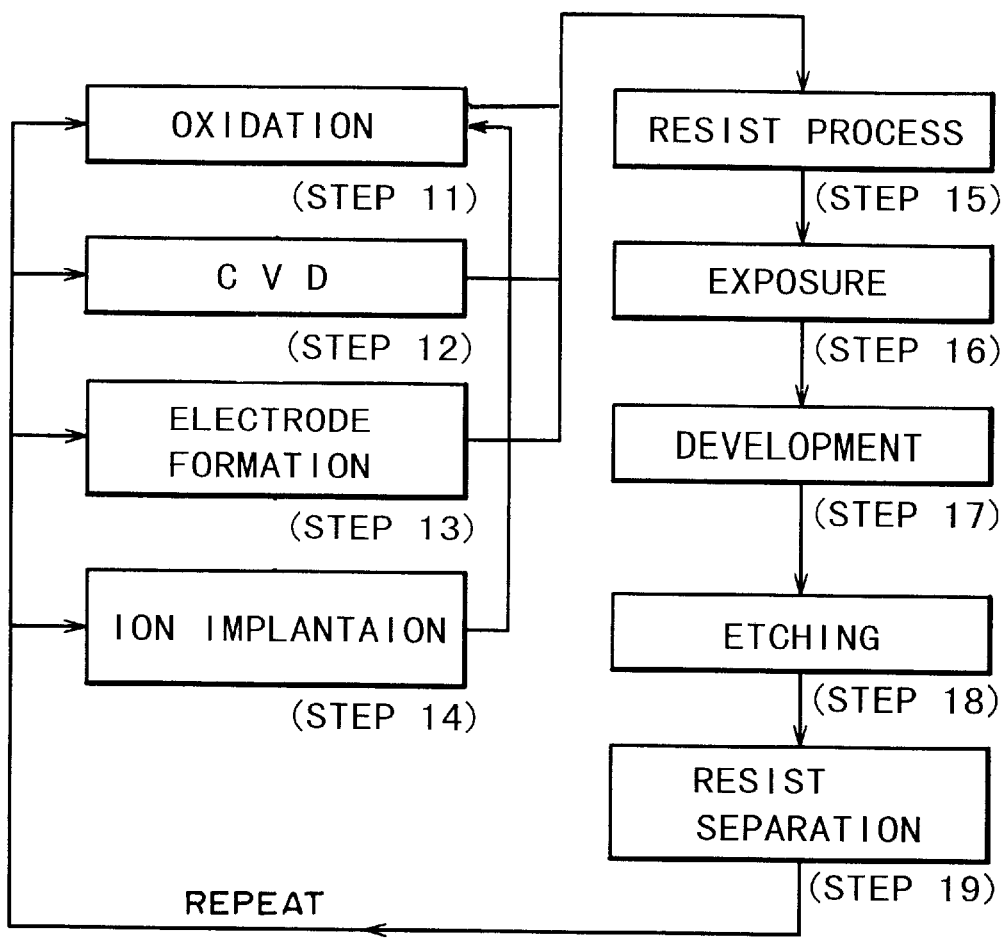
FIG. 9 is a flow chart for explaining details of a wafer process, included in the procedure of FIG. 8.

FIG. 9 is a flow chart showing details of the wafer process.

Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, large-size microdevices can be manufactured with reduced cost.

In accordance with the embodiments of the present invention as described hereinbefore, a whetstone is urged against a substrate holding surface by means of a whetstone urging mechanism while the holding surface is moved by a stage, to thereby perform cleaning of the holding surface. This enables that the same relative speed relative to the whetstone is established at every point on the holding surface contacted to the whetstone, and it assures uniform cleaning of the whole holding surface without relying on the skill of the operator. Further, conveyance of the whetstone is performed by use of substrate conveying means or a substrate transfer member for transferring a substrate to the holding surface. This removes the necessity of a maintenance area for the cleaning of the substrate holding surface, and it effectively simplifies the structure of the apparatus.

Further, an access opening for loading a whetstone into the exposure apparatus is provided. Additionally, the whetstone can be picked up out of a container cassette having been introduced into the exposure apparatus through this access opening. This enables supply and collection of the whetstone without opening the cover of the exposure apparatus, and effectively prevents a decrease of cleanness inside the apparatus due to exposure to the external environment.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus, comprising:
   a chuck having a holding surface for holding a substrate;
   a stage for holding said chuck;
   an urging mechanism for the holding surface;
   relay pins having a whetstone attracting portion for attracting a whetstone, the attracting portion being defined at an upper end of said relay pins, wherein the holding surface is relatively movable upwardly and downwardly relative to the upper end, and wherein the whetstone is attracted to and held at the upper end in a state in which the holding surface is placed lower than the upper end position; and
   a conveying mechanism for conveying the whetstone to said stage,
   wherein the whetstone has a conveyance holding surface, defined on a cleaning surface of the whetstone, that enables said conveying mechanism to hold the whetstone during conveyance of the whetstone, and
   wherein, when said stage having the whetstone placed thereon moves between said conveying mechanism and said urging mechanism, the whetstone is held by attraction on said relay pins, and said stage is moved while the whetstone is urged against the holding surface, for cleaning the holding surface.

2. An apparatus according to claim 1, further comprising a conveying hand for conveying the substrate to the holding surface, wherein said conveying mechanism uses said conveying hand for conveyance of the whetstone.

3. An apparatus according to claim 1, further comprising a rotation limiting mechanism for preventing rotation of said urging mechanism.

4. An apparatus according to claim 1, wherein said urging mechanism includes a pressing mechanism for pressing the whetstone against the holding surface by a predetermined pressure.

5. An apparatus according to claim 1, wherein the whetstone is provided with a magnetic material, and said urging mechanism is operable to perform mounting and demounting of the whetstone by use of an electromagnet.

6. An apparatus according to claim 1, wherein the whetstone is formed with a recess, and said urging mechanism has a protrusion engageable with the recess.

7. An apparatus according to claim 1, wherein the movement of said stage relative to the whetstone comprises one of rectilinear motion, circular motion and a combination of rectilinear motion and circular motion.

8. An apparatus according to claim 1, further comprising a chamber having an opening through which the whetstone can be introduced into said exposure apparatus.

9. An apparatus according to claim 8, wherein said conveying mechanism is operable to pick up the whetstone, as accommodated in a container cassette having been introduced into said exposure apparatus, out of the cassette, and to convey the whetstone toward said urging mechanism.

10. An apparatus according to claim 1, wherein said conveying mechanism is operable to pick up the whetstone, as accommodated in a container cassette having been introduced into said exposure apparatus, out of the cassette, and to convey the whetstone toward said urging mechanism, the container cassette having a positioning member for positioning the whetstone.

11. An apparatus according to claim 10, wherein the container cassette is used while being placed on a substrate cassette carrying table.

12. An apparatus according to claim 10, further comprising a first slot for accommodating therein the whetstone before the whetstone is cleaned and a second slot for accommodating therein the whetstone after the whetstone is cleaned.

13. An apparatus according to claim 11, further comprising a sensor for detecting the wafer, said sensor being provided on the substrate cassette carrying table.

14. An apparatus according to claim 13, wherein said sensor also detects the whetstone.

15. A cleaning whetstone for cleaning a holding surface of a wafer chuck in an exposure apparatus, said whetstone comprising:

a cleaning surface;

a holding portion engageable with a holding member for holding the whetstone; and a conveyance holding surface, defined on the cleaning surface, that enables a conveying mechanism to hold, by attraction, the whetstone during conveyance of the whetstone.

16. A whetstone according to claim 15, wherein said holding member is provided by at least one of (i) an urging mechanism for urging the whetstone against the holding surface of the wafer chuck, (ii) a transfer member protruded from the holding surface of the wafer chuck, (iii) a positioning member for a whetstone cassette for accommodating the whetstone therein, and (iv) a hand mechanism for holding the whetstone by attraction and for conveying the same.

17. A cleaning whetstone for cleaning a holding surface of a wafer chuck in an exposure apparatus, said whetstone comprising:

a cleaning surface;

a holding portion engageable with a holding member for holding the whetstone;

a surface step defined on said cleaning surface in relation to the position of a relay pin, such that the relay pin is able to receive said whetstone from a whetstone conveying mechanism and to attract and hold said whetstone; and a conveyance holding surface, defined on said cleaning surface of said whetstone, that enables a conveying mechanism to hold said whetstone during conveyance of said whetstone.

* * * * *

UNITED STATES PATENT AND TRADEMARK OFFICE
CERTIFICATE OF CORRECTION

PATENT NO. : 6,573,979 B2
DATED : June 3, 2003
INVENTOR(S) : Kohei Yamada

It is certified that error appears in the above-identified patent and that said Letters Patent is hereby corrected as shown below:

<u>Title page,</u>
Item [57], ABSTRACT,
Line 11, "to" should be deleted.

<u>Column 1,</u>
Line 30, "made" should read -- done --.
Line 34, "uniform" should read -- uniformly --.
Line 37, the first occurrence of "of" should read -- in --.
Line 64, "to" should be deleted.

<u>Column 3,</u>
Line 41, "exclusive" should read -- exclusively --.

<u>Column 4,</u>
Line 37 "placed" should read -- to place --.

<u>Column 6,</u>
Line 27, "to" should be deleted.
Line 28, "of" should be deleted.

<u>Column 7,</u>
Line 46, "to" should read -- onto --.

Signed and Sealed this

Eighteenth Day of November, 2003

JAMES E. ROGAN
*Director of the United States Patent and Trademark Office*